United States Patent
Wang et al.

(10) Patent No.: US 11,439,050 B2
(45) Date of Patent: Sep. 6, 2022

(54) MARK RECOGNITION DEVICES, MARK RECOGNITION METHODS AND PSEUDO PRESSURE ALIGNMENT DEVICES

(71) Applicant: KunShan Go-Visionox Opto-Electronics Co., Ltd., Kunshan (CN)

(72) Inventors: Yateng Wang, Kunshan (CN); Peilin Xiong, Kunshan (CN); Dong Han, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 384 days.

(21) Appl. No.: 16/718,371

(22) Filed: Dec. 18, 2019

(65) Prior Publication Data
US 2020/0128707 A1    Apr. 23, 2020

Related U.S. Application Data

(63) Continuation of application No. PCT/CN2018/105134, filed on Sep. 12, 2018.

(30) Foreign Application Priority Data

Jun. 27, 2018    (CN) .......................... 201810705969.7

(51) Int. Cl.
*H05K 13/00*    (2006.01)
*H05K 1/02*    (2006.01)
*H05K 3/00*    (2006.01)

(52) U.S. Cl.
CPC ....... *H05K 13/0015* (2013.01); *H05K 1/0269* (2013.01); *H05K 3/0008* (2013.01); *H05K 2201/09918* (2013.01)

(58) Field of Classification Search
CPC .............. H05K 3/303; H05K 13/0015; H05K 2201/09918; H05K 13/081; G01B 11/27
See application file for complete search history.

(56) References Cited

U.S. PATENT DOCUMENTS

| | | | |
|---|---|---|---|
| 7,141,450 B2 * | 11/2006 | Pardo | G01B 11/27 |
| | | | 438/107 |
| 2009/0236425 A1 | 9/2009 | Redmann et al. | |
| 2012/0127485 A1 * | 5/2012 | Yamauchi | H01L 24/75 |
| | | | 356/614 |

FOREIGN PATENT DOCUMENTS

| CN | 102012607 A | 4/2011 |
|---|---|---|
| CN | 103412428 A | 11/2013 |

(Continued)

OTHER PUBLICATIONS

Korean Notification of Reason for Refusal for Application No. 10-2020-7007046 dated Apr. 21, 2021.
(Continued)

*Primary Examiner* — Steven Whitesell Gordon
(74) *Attorney, Agent, or Firm* — Ladas & Parry LLP

(57) ABSTRACT

A mark recognition device is applied to a substrate including a marked region. The mark recognition device includes; an image collecting mechanism and a first light source. The first light source emits a light beam, the light beam includes a first light beam and a second light beam. The first light beam is irradiated to the marked region of the substrate and blocked by a mark of the marked region to generate a marked orthographic projection on the image collecting mechanism. The second light beam is transmitted to the image collecting mechanism to form transmitted light. The image collecting mechanism recognizes the mark according to the marked orthographic projection of the mark and the (Continued)

second light beam. Recognition accuracy of the mark is effectively improved in embodiments of the present application.

14 Claims, 6 Drawing Sheets

(56) References Cited

FOREIGN PATENT DOCUMENTS

| CN | 103676284 A | 3/2014 |
|---|---|---|
| CN | 104536186 A | 4/2015 |
| CN | 204479877 U | 7/2015 |
| CN | 105044942 U | 11/2015 |
| CN | 106385771 A | 2/2017 |
| CN | 106711074 A | 5/2017 |
| CN | 206948732 U | 1/2018 |
| CN | 105044942 B | 3/2018 |
| CN | 108195847 A | 6/2018 |
| JP | 2008-181010 A | 8/2008 |
| TW | 201525536 A | 7/2015 |
| WO | WO-2009093445 A1 * | 7/2009 ........... G01B 11/002 |
| WO | 2009093445 A1 | 5/2011 |

OTHER PUBLICATIONS

Chinese First Office Action for CN Application No. 201810705969.7 dated Jul. 16, 2019 and English Translation.
Chinese Second Office Action for CN Application No. 201810705969.7 dated Sep. 10, 2019 and English Translation.
Chinese Third Office Action for CN Application No. 201810705969.7 dated Nov. 8, 2019 and English Translation.
Notice of Second Final Rejection for Application No. 10-2020-7007046 dated Dec. 23, 2021.
Decision of Rejection for Amendment for Application No. 10-2020-7007046 dated Dec. 23, 2021.
PCT International Search Report of PCT/CN2018/105134 dated Mar. 27, 2019.
PCT Written Opinion of PCT/CN2018/105134 dated Mar. 27, 2019.
Taiwan First Office Action for Application No. 107133760 dated May 31, 2019.

* cited by examiner

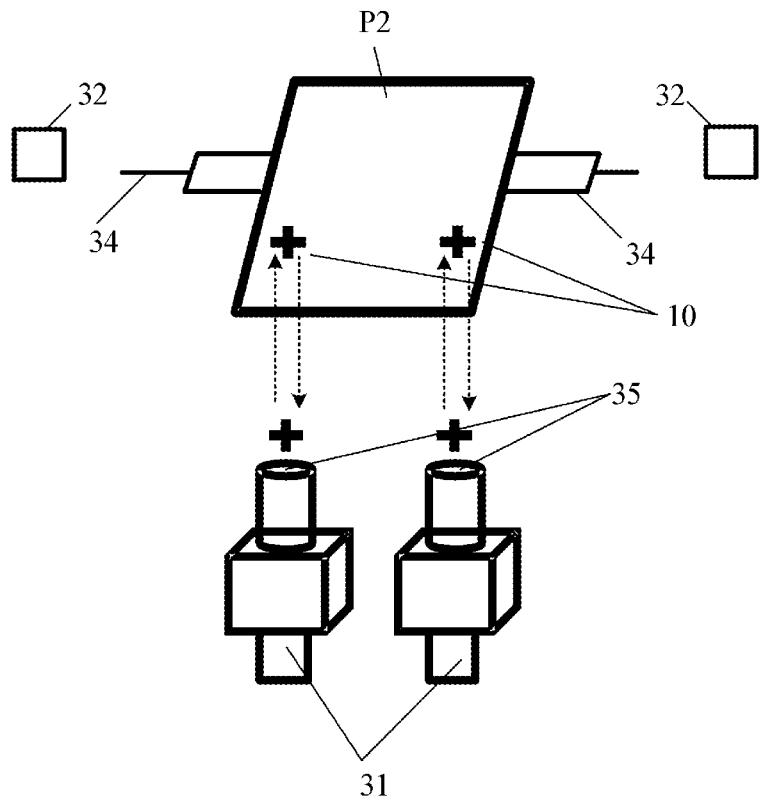

FIG. 3c

Emitting, by a first light source, illumination light to a marked region of a first substrate, and making a part of the illumination light being blocked by a mark of the marked region to form an orthographic projection on an image collecting mechanism, another part of the illumination light being vertically transmitted to the image collecting mechanism ⎯ S41

Collecting, by the image collecting mechanism, the orthographic projection and transmitted light to recognize the mark of the first substrate ⎯ S42

FIG. 4

MARK RECOGNITION DEVICES, MARK RECOGNITION METHODS AND PSEUDO PRESSURE ALIGNMENT DEVICES

CROSS-REFERENCE TO RELATED APPLICATIONS

This present application is a continuation of international Application No. PCT/CN2018/105134 filed on Sep. 12, 2018, which claims priority to Chinese patent application No. 201810705969.7 filed on Jun. 27, 2018. Both applications are incorporated herein by reference in their entireties.

TECHNICAL FIELD

Embodiments of the present application relate to the field of process device technologies, in particular to mark recognition devices, mark recognition methods and, pseudo pressure alignment devices.

BACKGROUND

In the prior art, a Flexible Printed Circuit (FPC) is bonded to a screen substrate mainly by a pseudo pressure alignment. At present before a pseudo pressure alignment operation, a mark for alignment on the FPC or the screen substrate need to be recognized by an image collecting device including a Charge Coupled Device (CCD). However, a large number of concave and convex points are distributed on a surface of the screen substrate after the screen substrate is thinned. The concave and convex points may affect reflection of light at the mark and cause different degrees of refraction. And then, an image including the mark collected by the CCD image collecting device may be deviated or distorted, so that the mark cannot be accurately recognized.

SUMMARY

Embodiments of the present application provide mark recognition devices, mark recognition methods and pseudo pressure alignment devices, so as to solve a problem that the mark cannot be accurately recognized in the prior art.

In order to solve the above technical problem, the embodiments of the present application adopt the following technical solutions.

According to a first aspect, a mark recognition device according to an embodiment of the present application, applied to a substrate including a marked region, includes an image collecting mechanism and as first light source. The first light source emits a light beam including a first light beam and a second light beam. The first light beam is irradiated to the marked region of the substrate and blocked by a mark of the marked region to generate a marked orthographic projection on the image collecting mechanism, and the second light beam is transmitted to the image collecting mechanism to form transmitted light. The image collecting mechanism recognizes the mark according to the marked orthographic projection of the mark and the second light beam.

Optionally, the first light source is located directly above the image collecting mechanism, the first light beam emitted by the first light source is vertically irradiated to the marked region of the substrate, and the second light beam emitted by the first light source penetrates and irradiates the substrate and is vertically irradiated to the image collecting mechanism.

Optionally, the mark recognition device further includes an optical compensation module compensating the light beam emitted by the first light source. A compensated light beam passes through a transparent region of the marked region and is vertically irradiated to the image collecting mechanism.

Optionally, the mark recognition device further includes a uniform scattering layer for uniform light. The uniform scattering layer is stacked on the substrate, and the light beam emitted by the first light source is irradiated to the substrate through the uniform scattering layer.

Optionally, the first light source is located above a side of the image collecting mechanism, the light beam emitted by the first light source is irradiated to the uniform scattering layer, and the light beam is uniformly scattered by the uniform scattering layer and then irradiated to the substrate and vertically irradiated to the image collecting mechanism through the substrate.

Optionally, the uniform scattering layer is an Anisotropic Conductive Film layer.

Optionally, an angle between the light beam emitted by the first light source and the substrate ranges from 30° to 60°.

Optionally, the angle between the light beam emitted by the first light source and the substrate is 45°.

Optionally, the number of the first light sources is the same as the number of the marks of the marked region of the substrate, and the first light source is irradiated in one-to-one correspondence with the mark.

Optionally, the first light source is one of a coaxial light source, a collector light source and a strip light source.

Optionally, the mark recognition device further includes a light source carrying portion carrying the first light source. The first light source is fixedly disposed on the light source carrying portion, or the first light source is movably disposed on the light source carrying portion by a moving mechanism.

Optionally, the mark recognition device further includes a support table fixedly supporting the substrate.

Optionally, the mark recognition device further includes a second light source located at one side of the substrate closed to the image collecting mechanism. The second light source is vertically irradiated to the marked region of the substrate, and light reflected by the mark of the marked region is vertically irradiated to the image collecting mechanism.

Optionally, the second light source is, located on the image collecting mechanism.

Optionally, the substrate includes a first substrate and a second substrate which are stacked, the first light source irradiating a mark of the first substrate for recognizing, and the second light source irradiating a mark of the second substrate for recognizing.

Optionally, the first substrate is a Low Temperature Poly-Silicon substrate, and the second substrate is a Flexible Printed Circuit or a driver chip.

Optionally, the number of the first light sources is at least one; and/or the number of the second light sources is at least one; and/or the number of the image collecting mechanisms is at least one.

According to a second aspect, a mark recognition method according to an embodiment of the present application, applied to a substrate including a marked region, includes emitting, by the first light source, a light beam including a first light beam and a second light beam to the marked region of the substrate, the first light beam being blocked by a mark to form a marked orthographic projection, and the second light beam penetrating and irradiating the substrate; and collecting, by an image collecting mechanism, the marked orthographic projection and the second light beam after penetrating and irradiating the substrate, and performing a mark recognition operation according to the marked orthographic projection and the second light beam after penetrating and irradiating the substrate.

According to a third aspect, a pseudo pressure alignment device according to an embodiment of the present application, applied to a plurality of substrates including a marked region, includes the mark recognition device described in any one of the above embodiments, a control device, an alignment mechanism and a pressing mechanism.

The control device is communicably connected with the mark recognition device, the alignment mechanism and the pressing mechanism separately. The mark recognition device recognizes marks of the plurality of substrates. The alignment mechanism performs an alignment operation on the plurality of substrates. The pressing mechanism performs a pressing operation on the plurality of substrates. The control device controls the alignment mechanism to perform the alignment operation and controls the pressing mechanism to perform the pressing operation according to the marks recognized by the mark recognition device.

The above at least one technical solution adopted by the embodiments of the present application may achieve the following beneficial effects.

According to the above technical solutions, the first light source is separately disposed from the image collecting mechanism, and the part of the illumination light emitted by the first light source in the marked region of the substrate may generate the orthographic projection, and another part of the illumination light may be vertically transmitted to the image collecting mechanism. Thereby the mark of the substrate may be recognized by the image collecting mechanism according to the collected light and the orthographic projection generated by blocking the mark. In this way, a problem in the prior art that when the mark of the substrate is recognized by a reflection method, the mark is recognized inaccurately due to deviation of reflected light caused by concave and convex points on the substrate is avoided. During a process of the substrate being vertically transmitted by the illumination light in the present application, the deviation of transmitted light caused by the concave and convex points may be minimized or avoided as much as possible, so as to ensure that the projection generated by blocking the mark is the orthographic projection as far as possible. Thereby the mark may be accurately recognized.

BRIEF DESCRIPTION OF DRAWINGS

Accompanying drawings described herein are intended to provide further understanding of the present application, and constitute a part of the present application. Schematic embodiments of the present application and the description thereof are used to explain the present application instead of constituting an improper limitation of the present application. In the accompanying drawings:

FIG. 3b and FIG. 3c show schematic structural diagrams of a mark recognition device according to still another embodiment of the present application;

FIG. 4 shows a schematic diagram showing steps of a mark recognition method according to yet still another embodiment of the present application;

DETAILED DESCRIPTION

In order to make objects, technical solutions and advantages of the present application clearer, the technical solutions of the present application will be clearly and completely described in the following with reference to specific embodiments of the present application and corresponding accompanying drawings. Obviously, the described embodiments are only a part of the embodiments of the present application, and not all of the embodiments. All other embodiments obtained by those skilled in the art according to the embodiments of the present application without creative efforts are within the scope of the present application.

The technical solutions according to the embodiments of the present application are described in details below with reference to the accompanying drawings.

Figure 1:
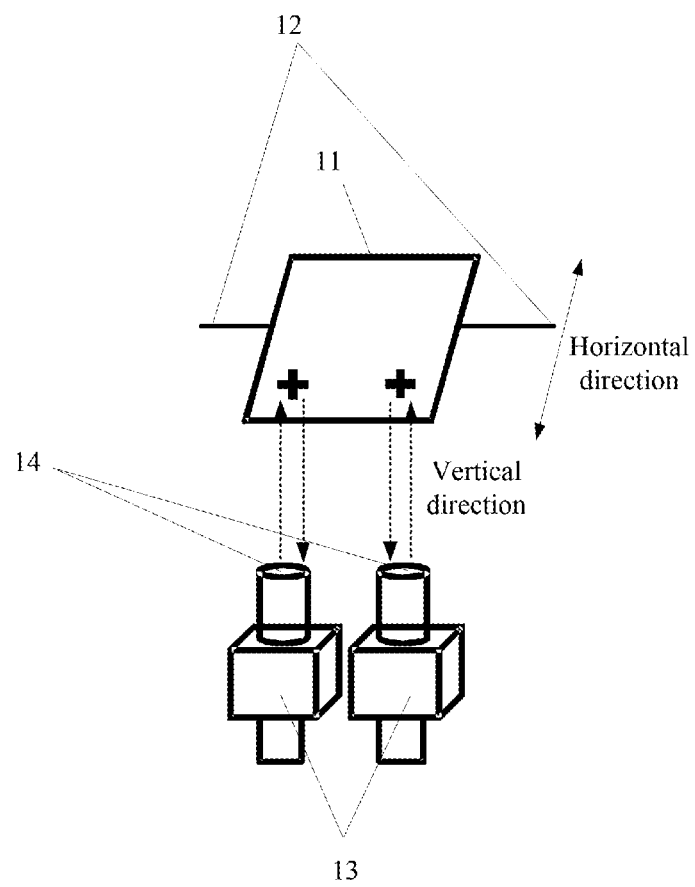
FIG. 1 shows a schematic structural diagram of a mark recognition device in the prior art.

FIG. 1 shows a schematic structural diagram of a mark recognition device in the prior art. Referring to FIG. 1, taking a screen substrate as an example, the screen substrate 11 is disposed on a support table 12, and the support table 12 may be a hollow table. CCD image collecting devices 13 are generally disposed under the support table 12, and light emitted by light sources 14 respectively disposed on the CCD image collecting devices 13 is irradiated onto the screen substrate 11. Since marks are generally opaque, and therefore, light located at each of the marks is reflected back to the corresponding CCD image collecting device 13, and light located at other positions of the screen substrate 11 is transmitted. Thus, an image including the mark may be formed by the corresponding CCD image collecting, device 13 according to the collected light reflected by the mark of the screen substrate 11. However, a large number of concave and convex points are distributed on a surface of the screen substrate after the screen substrate is thinned. The concave and convex points may affect reflection of light at the marks and cause different degrees of refraction. And then, the image including the mark collected by the corresponding CCD image collecting device may be deviated or distorted, so that the mark cannot be accurately recognized.

The existing mark recognition device with lower recognition accuracy seriously affect fabrication yields of bonding, alignment, pressing or other processes associated with mark recognition in a production process. Taking the bonding process as an example, after performing mark recognition based on the existing mark recognition device, a bonding defect rate caused by a mark recognition error is as high as 1.5%. An overall yield of panel production is seriously affected by the high bonding defect rate, and production resources are wasted.

Therefore, a new mark recognition device is proposed by the embodiments of the present application to improve a problem of low recognition accuracy of the existing mark recognition device.

Figure 2:
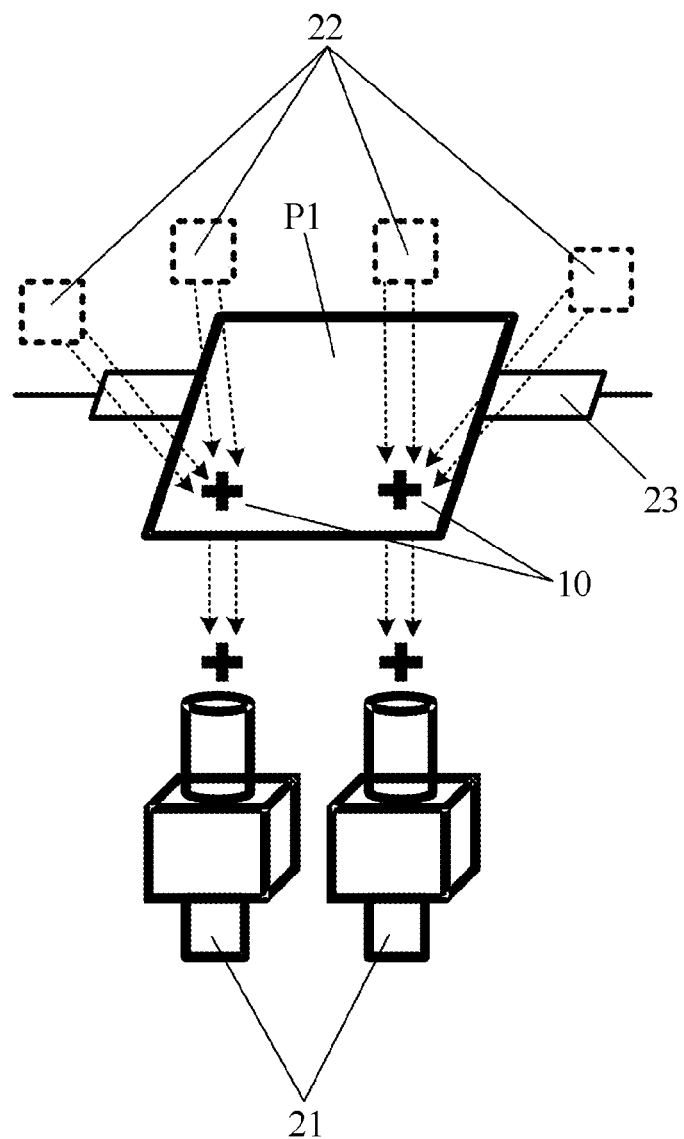
FIG. 2 shows a schematic structural diagram of a mark recognition device according to an embodiment of the present application.

FIG. 2 shows a schematic structural diagram of a mark recognition device according to an embodiment of the present application. Referring to FIG. 2, the mark recognition device mentioned in the embodiments of the present application includes: at least one image collecting mechanism 21, at least one first light source 22 and a support table 23. The support table 23 supports a first substrate P1 to be recognized, and the at least one image collecting mechanism 21 and the at least one first light source 22 are respectively disposed to two opposite sides parallel to an extending direction of the first substrate P1.

The support table 23 may also be provided as a hollow table as needed, and the first substrate P1 may be supported by a peripheral support ring, or supported by other arm type support members, which is not limited in the present application.

In addition, it may be understood that, in the present application, the at least one first light source 22 may be disposed separately from the at least one image collecting mechanism 21, and communication connections between the at least one first light source 22 and the at least one image collecting mechanism 21 may be implemented by means of a connecting wire or other wireless connections.

Specifically, continuing to refer to FIG. 2, the image collecting mechanisms 21 are located at a lower side (a lower side of an orientation shown in FIG. 2) of the support table 23 (actually the first substrate P1), and the first light sources 22 are disposed separately from the image collecting mechanisms 21. Specific positions of the first light sources 22 are not specifically shown in FIG. 2. The first tight sources 22 emit illumination light (i.e., light beams) to a marked region of the first substrate P1. A part of the illumination light (i.e., a first light beam) is blocked by marks of the marked region, and therefore, orthographic projections are generated on the image collecting mechanisms 21. The other part of the illumination light (i.e., a second light beam) is vertically transmitted to the image collecting mechanisms 21.

It may be noted that the marked region refers to a region within a preset range including a mark. A specific value of the preset range may be set according to an actual situation, which is not uniformly defined in the embodiments of the present application.

Marks 10 of the marked region in the first substrate P1 are opaque cross marks, and the marked region is transparent except for the marks 10. It may be noted that, in the embodiments of the present application, the first substrate P1 is a transparent substrate including the opaque marks 10, and specifically may be a Low Temperature Poly-Silicon (TPS) substrate. Generally, the LTPS substrate is used as a screen substrate, and the marks 10 of the LTPS substrate are made of a metal material or other opaque material. Therefore, the marks 10 are opaque and may play a blocking role.

It may be noted that connection relationships among the image collecting mechanisms 21, the first light sources 22 and the support table 23 may be not limited. Communication connections among the image collecting mechanisms 21, the first light sources 22 and the support table 23 may be specifically implemented according to a wired connection or a wireless connection.

Each of the image collecting mechanisms 21 recognizes the corresponding mark 10 of the first substrate P1 according to the collected orthographic projection and the collected transmitted light.

It may be understood that the light collected by the image collecting mechanisms 21 is vertically transmitted. Therefore, after the marks 10 of the first substrate P1 are irradiated by the illumination light, since the marks 10 have an opaque performance, the orthographic projections are formed at the lower side (in collection regions of the image collecting mechanisms 21). And then, the accurate marks 10 may be collected by the image collecting mechanisms 21.

According to the above technical solutions, the first light sources 22 are separately disposed from the image collecting mechanisms 21. The part of the illumination light emitted by the first light sources 22 to the marked region of the first substrate P1 may generate the orthographic projection, and the other part of the illumination light emitted by the first light sources 22 may be vertically transmitted to the image collecting mechanisms 21. Thereby the image collecting mechanisms 21 are facilitated to recognize the marks 10 of the first substrate P1 according to the collected orthographic projections and the collected transmitted light. In this way, the problem in the prior art that when the marks of the screen substrate 11 are recognized by a reflection method, reflected light may be deviated due to concave and convex points on the screen substrate 11, so that the marks may not be accurately recognized is avoided.

It may be understood that, in the present application, in a process of the illumination light is vertically transmitted from the first substrate P1, deviation of the vertical transmitted light due to the influence of the concave and convex points may be minimized or avoided. In this way, it is possible to ensure that projections produced by blocking the marks 10 are the orthographic projection. Thereby the marks 10 may be accurately recognized.

In addition, it may be noted that when the first substrate P1 is a LTPS substrate, if the reflected light is collected and the marks are recognized with reference to the conventional manner shown in FIG. 1, since the marks 10 are disposed on an upper surface of the first substrate P1 (i.e., an upper surface of an orientation shown in FIG. 1, i.e., a surface of the first substrate P1 deviating from the image collecting mechanisms 21), when the illumination light is irradiated front the lower side to the marks 10, part of the LTPS substrate needs to be passed by the illumination light. Since the LTPS substrate may have a color, when the illumination light after passing through the LTPS substrate is reflected by the marks 10 to the image collecting mechanisms 21, the reflected light may have the color. Thus, the recognized marks 10 may have a gray scale, and then mark recognition may be affected. In the solutions of the present application, the vertical transmitted light, is collected and the orthographic projections are generated by blocking the marks 10. Thus, a problem that the marks 10 have the gray scale may be avoided, and the recognition quality of the marks is improved.

It may be understood that in the embodiments of the present application, the mark recognition device may be a separate device or an integrated device that may be combined with other functional components to implement a compatible function.

In another embodiment of the present application, a mark recognition device does not include the support table 23. That is, the first substrate P1 to be recognized does not need to be fixedly supported by the support table 21. It may be understood that, in the embodiments of the present application, it is sufficient to ensure that the image collecting mechanisms 21 and the first light sources 22 are respectively disposed on two opposite sides parallel to the extending direction of the first substrate P1, all or part of the light of the first light sources 22 may be irradiated to the first substrate P1, and the light that the first light sources 22 irradiate on the first substrate P1 may be collected by the image collecting mechanisms 21.

Several structural embodiments of the mark recognition devices mentioned in the present application are described below.

Figure 3A:
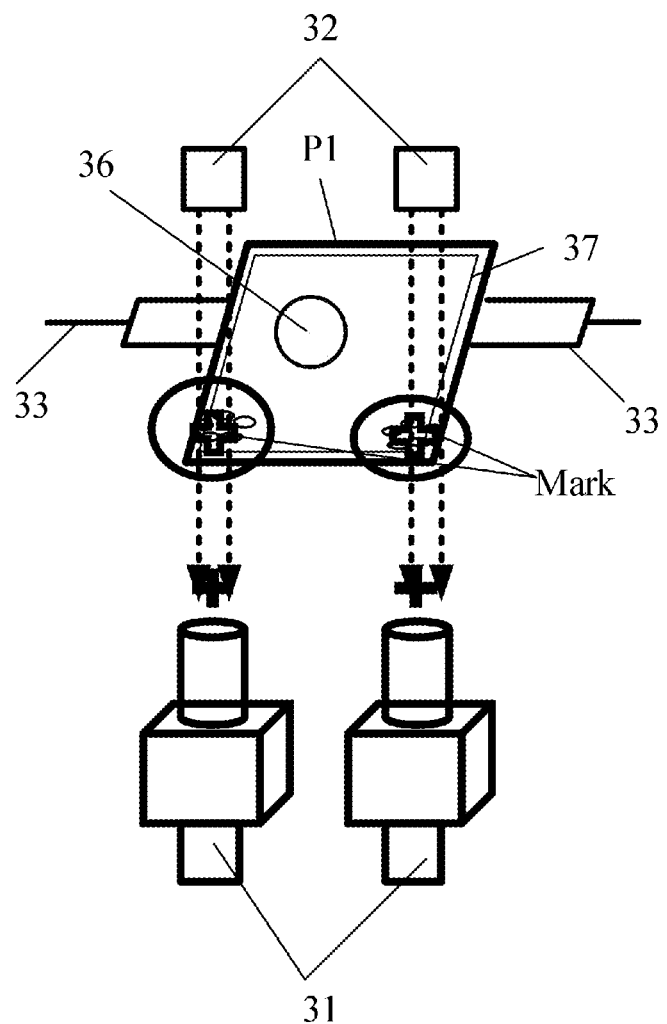
FIG. 3a shows a schematic structural diagram of a mark recognition device according to another embodiment of the present application.

FIG. 3a shows a schematic structural diagram of a mark recognition device according to another embodiment of the present application. In the mark recognition device according to the embodiment of the present application, a first light source is disposed directly above an image collecting mechanism.

Specifically, referring to FIG. 3a, first light sources 32 are respectively disposed directly above image collecting mechanisms 31. Illumination light of each of the first light sources 32 is vertically irradiated on a Marked region of a first substrate P1 (the first substrate P1 is supported by a first support table 33) between the first light sources 32 and the image collecting mechanisms 31. Another part of the illumination light of each of the first light sources 32 passes through a transparent region of the marked region and is vertically transmitted to the corresponding image collecting mechanism 31.

Similarly, in the mark recognition device shown in FIG. 3a, the marked region of the first substrate P1 is opaque only at positions where the marks 10 are located. Orthographic projections of the first light sources 32 in a vertical direction (a vertical direction of an orientation shown in FIG. 3a) may respectively fall into regions where the image collecting mechanisms 31 are located. Specifically, the orthographic projection of each of the first light sources 32 in the vertical direction falls into a position where a camera of the corresponding image collecting mechanism 31 is located. In this way, the light of the first light sources 32 may be vertically irradiated on the marked region, and the vertical transmitted light may be collected by the image collecting mechanisms 31 as much as possible.

As shown in FIG. 3a, the first light sources 32 emit the light downward, and the light is vertically transmitted to the image collecting mechanisms 31 through the marked region. The marks 10 cannot be penetrated b the light irradiated to the marks 10, so that the orthographic projections of the marks 10 may be clearly formed at the lower side. And thus, the orthographic projections may be accurately recognized by the corresponding image collecting mechanisms 31. Moreover, considering that the light is transmitted vertically, deviation of the projections of the marks 10 do not occur, and recognition accuracy is improved.

It may be understood that, in the mark recognition device, the first light sources 32 may be and cart be disposed directly above the image collecting mechanisms 31 without affecting the image collecting mechanisms 31 to collect or recognize a mark of other substrates, or without affecting a mechanism design directly above the entire mark recognition device.

Figure 3B:
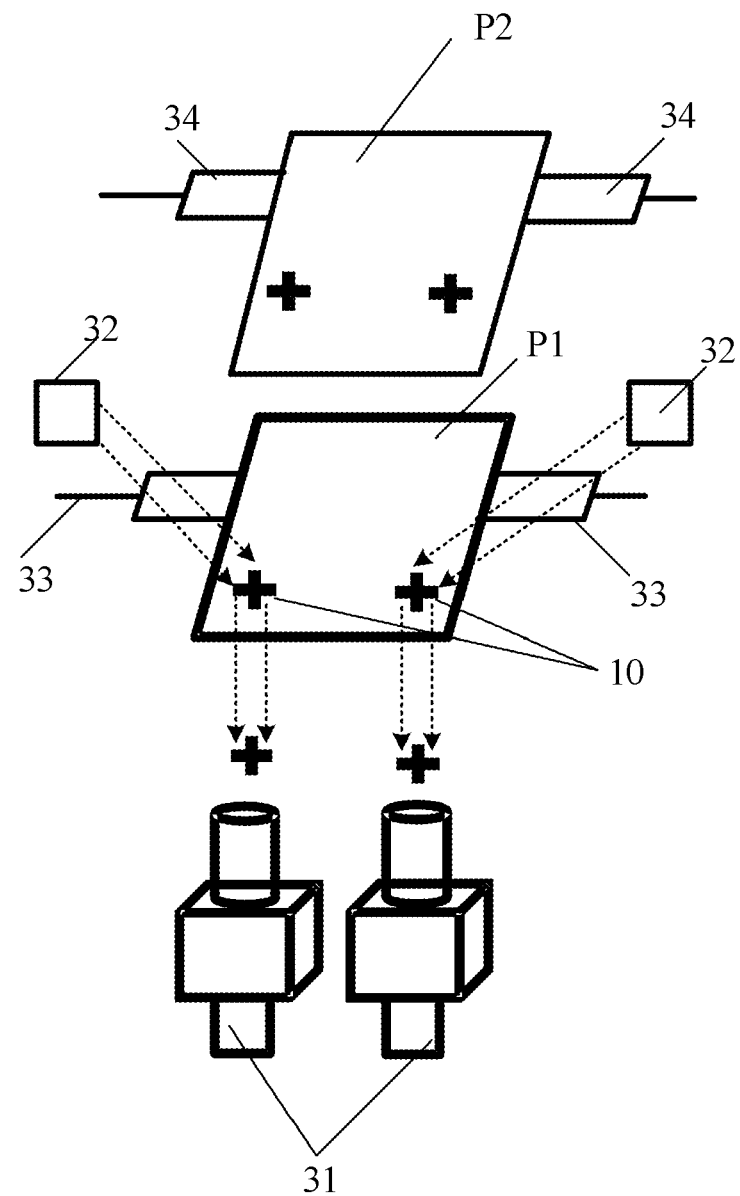

FIG. 3b shows a schematic structural diagram of a mark recognition device according to still another embodiment of the present application. In the mark recognition device according to the embodiments of the present application, a first light source is disposed above a side of an image collecting mechanism.

Referring to FIG. 3b, first light sources 32 are disposed above one or more sides of image collecting mechanisms 31. Illumination light may be obliquely incident on a marked region of a first substrate P1 between a second substrate P2 and the image collecting mechanisms 31. Another part of the illumination light is scattered by anisotropic conductive adhesive attached to a surface of the first substrate P1 to generate uniform light. The uniform light passes through a transparent region of the marked region and is vertically transmitted to the image collecting mechanisms 31.

Specifically, as shown in FIG. 3b, the mark recognition device may be respectively recognized the first substrate P1 and the second substrate P2 that need to be bonded together. The first substrate P1 is supported above the image collecting mechanisms 31 by a first support table 33, and the second substrate P2 is supported above the first, substrate P1 by a second support table 34. Since a distance between the first substrate P1 and the second substrate P2 (or the second support table 34 supporting the second substrate P2) is very small, the first light sources 32 cannot be disposed in an interlayer between the first substrate P1 and the second substrate P2. And therefore, the first light sources 32 are disposed in an edge region outside the interlayer between the first substrate P1 and the second substrate P2, so that the marked region of the first substrate P1 may be irradiated by the first light sources 32 through a slit of the interlayer.

It may be understood that the second substrate P2 involved in the embodiments of the present application may be a Flexible Printed Circuit (FPC) or a driver chip Integrated Circuit (IC), or other chips that may be bonded on a screen substrate.

Similarly, in the mark recognition device shown in FIG. 3b, the marked region of the first substrate P1 is opaque only at positions where the marks 10 are located.

Optionally, a uniform scattering layer 37 is further attached on an upper surface of the first substrate P1, and the uniform scattering layer is for uniform light. In an actual application process, a light beam emitted by one of the first light sources 32 is irradiated to the uniform scattering layer, and the light beam is uniformly scattered by the uniform scattering layer and then irradiated to the first substrate P1. Thereby the light may be uniformly transmitted from the marked region of the first substrate P1 to the image collecting mechanisms 31, and at least part of the light may be vertically transmitted. Therefore, the deviation of the projections of the marks 10 do not occur, and then the recognition accuracy is improved.

Optionally, the uniform scattering layer is an Anisotropic Conductive Film (ACF) layer. It may be understood that, since the Anisotropic Conductive Film layer is translucent and a surface of the Anisotropic Conductive Film layer is rough, light irradiated on the Anisotropic Conductive Film layer may be scattered. Thereby the light may be uniformly transmitted from the marked region to the image collecting mechanisms 31, and then the recognition accuracy may be improved.

Optionally, in the embodiments of the present application, referring to FIG. 3b, an angle θ between oblique incident light of each of the first light sources 32 and the first substrate P1 ranges from 30° to 60°.

Optionally, in an actual using process, the angle θ between the oblique incident light of each of the first light sources 32 and the first substrate P1 is set to 45°, so as to ensure that the light incident on the first substrate P1 may produce more vertical transmitted light in the marked region.

Optionally, in the embodiments of the present application, referring to FIG. 3c, marks of the second substrate P2 need to be recognized. Therefore, the mark recognition device may further include:

at least one second light source 35 disposed on the image collecting mechanisms 31. The second light source 35 vertically irradiates a marked region or the second substrate P2 when the marks 10 of the second substrate P2 need to be recognized.

It may be noted that, in order to clearly display a mark recognition process of the second substrate P2, structures of the first substrate P1 and the first support table 33 are not shown in FIG. 3c.

It may be understood that when the second light sources 35 are in operation, the mark recognition device only includes the second substrate P2, excluding a first substrate. At this time, the second light sources 35 emit light upward, and the light is vertically irradiated on the marked region of the second substrate P2. The marks 10 of the second substrate P2 are also opaque, and each mark is reflective by a metal surface (the FPC is a gold finger, the IC is a gold bump), so that the marks may be recognized by the image collecting mechanisms 31.

In another embodiment of the present application, the mark recognition device is optically compensated by an optical compensation processor 36 to improve an application environment adaptability of the mark recognition device.

Specifically, the mark recognition device may further include: the optical compensation module. It may be understood that the optical compensation module may be an optical processor disposed on a surface of the first substrate P1. Regardless of a position of the first light source, illumination light may be optically compensated by a compensation algorithm to ensure that the light emitted by the first substrate P1 is vertical transmitted light. In fact, the optical compensation module may also be set at any position on an optical path of the illumination light emitted by the first light source, as long as the setting may be realized. The involved compensation algorithm may be an effective algorithm determined according to principles of optical reflection, optical transmission, optical scattering and image processing algorithms.

Thereby, the illumination light is incident to the optical compensation module, and light compensated by the optical compensation module passes through the transparent region of the marked region and is vertically transmitted to the image collecting mechanisms. Therefore, in a vertically transmitting process of the illuminating light from the first substrate, deviation of the vertical transmitted light caused by concave and convex points may be minimized or avoided, so as to ensure that projections produced by blocking the marks are orthographic projections. Thereby the marks may be accurately recognized.

Optionally, in the embodiments of the present application, the first light sources 32 of the mark recognition device shown in FIG. 3a are coaxial light sources. The first light sources 32 of the mark recognition device shown in FIG. 3b are collector light sources or strip light sources.

Optionally, in the solutions of the embodiments of the present application, the mark recognition device further includes: a light source carrying portion (not shown, in figures) carrying the first light sources 32. The first light sources 32 are fixedly disposed on the light source carrying portion, or the first light sources 32 are movably disposed on the light source carrying portion by a moving mechanism. Thus, in an actual mark recognition process, a position of each of the first light sources 32 may be adjusted according to a characteristic of the first substrate P1 to achieve a best irradiation effect. For example, the first substrate P1 only needs to recognize the marks, then each of the first light sources 32 may be adjusted to a position directly above the corresponding image collecting mechanism by using the moving mechanism. The first substrate P1 needs to be pseudo pressure aligned with the second substrate P2, and then each of the first light sources 32 may be adjusted to a position above a side of the corresponding image collecting mechanism by using the moving mechanism.

Optionally, the number of the first light sources 32 involved in the present application is the same as the number of the marks 10 of the first substrate P1. Moreover, each of the first light, sources 32 irradiates one corresponding mark 10. Thereby, the best irradiation effect may be achieved, and the recognition accuracy may be improved.

Optionally, the image collecting mechanisms 31 involved in the embodiments of the present application are CCD image collecting devices.

It may be understood that, the mark recognition device involved in the embodiments of the present application may be used in a manufacturing process of display panels such as an Organic Light-Emitting Diode (OLED) or a Liquid Crystal Display (LCD), such as an attachment process of a polarizer, a sealing process and a bonding process. In fact, the mark recognition device mentioned in the present application can be used in any application scenario that involves mark recognition, and the application scenario includes a substrate that conforms to the characteristic of the first substrate.

It may be noted that, in the embodiments of the present application, two image collecting mechanisms are set in the mark recognition devices as examples. In fact, setting two image collecting mechanisms is only to meet the need for two marks in the substrate to accurately align. In other mark recognition solutions, only one or more image collecting mechanisms may be set.

The embodiments of the present application also provide a mark recognition method. Specifically, FIG. 4 shows a schematic diagram showing steps of a mark recognition method according to yet still another embodiment of the present application. Referring to FIG. 4, the mark recognition method includes:

Step 41: emitting, by a first light source, illumination light to a marked region of a first substrate, and making a part of the illumination light being blocked by a mark of the marked region to form an orthographic projection on an image collecting mechanism, another part of the illumination light being vertically transmitted to the image collecting mechanism; and Step 42: collecting, by the image collecting mechanism, the orthographic projection and transmitted light to recognize the mark of the first substrate.

That is to say, in the mark recognition method according to the embodiments of the present application, firstly a light beam including a first light beam and a second light beam may be emitted by the first light source to the marked region of the substrate. The first light beam is blocked by the mark to form the orthographic projection of the mark, and the second light beam penetrates and irradiates the substrate. And then the orthographic projection of the mark and the second light beam after penetrating and irradiating the substrate may be collected by the image collecting mechanism. A mark recognition operation is performed according to the collected orthographic projection of the mark and the collected second light beam after penetrating and irradiating the substrate.

The mark recognition method will be respectively described below in combination with the mark recognition device shown in FIG. 3a and the mark recognition device shown in FIGS. 3b and 3c:

The mark recognition device shown in FIG. 3a is taken as an example, and mark recognition is only performed on the first substrate P1. After the first substrate P1 is supported by the first support table 33, the first substrate P1 may be initially adjusted to a position above the image collecting mechanisms 31 by automatically adjusting a position (upper, lower, left, and right) of the first substrate P1 (in fact, a position of the first support table 33 may be sufficient to meet a requirement of automatically adjusting the marks of the first substrate P1 to respectively align the positions above the image collecting mechanisms 31). Alternatively, after the first substrate P1 is carried by the first support table 33, each of the marks of the first substrate P1 may be initially recognized by the corresponding first light source 32 located above, and the position of the first substrate P1 is adjusted by the first support table 33 according to a calculated position, and then the first substrate P1 may be accurately disposed the position above the image collecting mechanisms 31. The image collecting mechanisms 31 and the first light sources 32 are always in an open state. A part of the illumination light emitted by each of the first light sources 32 is vertically irradiated downward on the marked region of the first substrate P1 and is blocked by the corresponding mark 10 to produce the orthographic projection, and another part of the illumination light passes through a transparent region of the marked region to exit a vertical transmitted light to the corresponding image collecting mechanism 31. Since the orthographic projections are formed, it is indicated that projections formed by the marks 10 are not deviated. And thus, the accurate marks may be collected by the image collecting mechanisms 31.

The mark recognition device shown in FIG. 3b and FIG. 3c is taken as an example. Firstly the marks of the second substrate P2 need to be recognized by the mark recognition device, and then the marks of the first substrate P1 need to be recognized by the mark recognition device. Firstly, the second substrate P2 is supported by the second support table 34, a position relationship is adjusted according to the above manners, and the first light sources 32 and the image collecting mechanisms 31 are always in the open state. The second light sources 35 are turned on, and light of the second light sources 35 is vertically irradiated upward onto the marked region of the second substrate P2. The light of the second light sources 35 is reflected back to the image collecting mechanisms 31 based on reflection effects of gold fingers at the marks, thereby the mark recognition of the second substrate P2 is realized. And then, the second light sources 35 are turned off, and the second support table 34 is moved upward by a distance. The first substrate P1 is pushed to a position above the image collecting mechanisms 31 by using the first support table 33. That is, the first substrate P1 is located between the second substrate P2 and the image collecting mechanisms 31, and a distance between the first substrate P1 and the second substrate P2 is very small. After the position of the first substrate P1 is adjusted, light of the first light sources 32 is incident at an angle of 45° to the marked region of the first substrate P1. Since collector light sources may be used in the first light sources 32, the best irradiation effect may be achieved by adjusting light source parameters such as the positions of the first light sources 32 and sizes of the light sources.

According to the above technical solutions, the first light sources are separately disposed from the image collecting mechanisms, and the part of the illumination light emitted by the first light sources in the marked region of the first substrate may generate the orthographic projections, and another part of the illumination light may be vertically transmitted to the image collecting mechanisms. Thereby the marks 10 of the first substrate P1 may be recognized by the image collecting mechanisms according to the collected light and the orthographic projections generated by blocking the marks 10. In this way, a problem in the prior art that when the mark of the substrate is recognized by a reflection method, the mark is recognized inaccurately due to deviation of reflected light caused by concave and convex points on the substrate is avoided. During a process of the first substrate P1 being vertically transmitted by the illumination light in the present application, the deviation of transmitted light caused by the concave and convex, points may be minimized or avoided as much as possible, so as to ensure that the projections generated by blocking the marks 10 are the orthographic projections as far as possible. Thereby the marks 10 may be accurately recognized.

Figure 5:
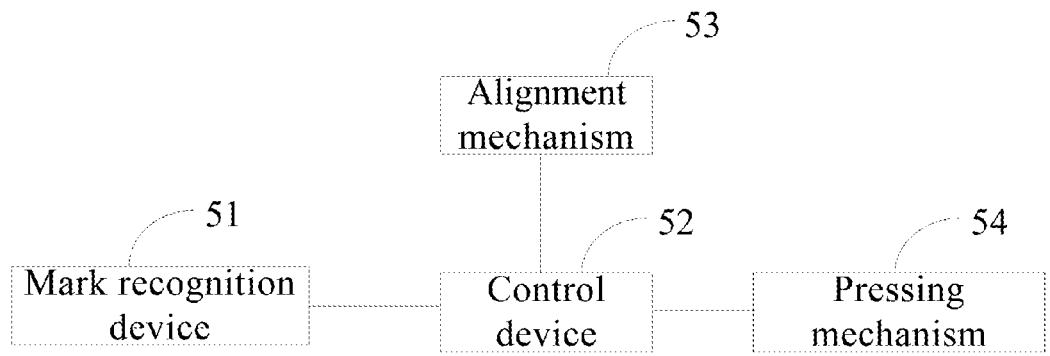
FIG. 5 shows a schematic structural diagram of a pseudo pressure alignment device according to yet still another embodiment of the present application.

FIG. 5 shows a schematic structural diagram of a pseudo pressure alignment device according to yet still another embodiment of the present application. As shown in FIG. 5, the pseudo pressure alignment device according to the embodiment of the present application includes the mark recognition device (i.e., the mark recognition device 51) mentioned in FIGS. 3b and 3c, and further includes a control device 52, an alignment mechanism 53 and a pressing mechanism 54.

The control device 52 is communicably connected with the alignment mechanism 53, the pressing mechanism 54 and the mark recognition device 51 separately. The alignment mechanism 53 may be controlled by the control device 52 to align a first substrate and a second substrate according to a mark recognized by the mark recognition device 51. The pressing mechanism 54 may be controlled by the control device 52 to press the first substrate and the second substrate.

The alignment mechanism 53 aligns the first substrate and the second substrate.

The pressing mechanism 54 presses the first substrate and the second substrate.

In an embodiment of the present application, communication connections between the control device 52 and the mark recognition device 51, the alignment mechanism 53 and the pressing mechanism 54 are realized by means of an electrical connection.

It may be understood that the pseudo pressure alignment device mentioned in the above embodiments of the present application not only can perform an alignment pressing operation on the first substrate and the second substrate, but also can perform the alignment pressing operation on a larger number of substrates, such as three or four, etc. The specific number of the substrates is not uniformly limited in the embodiments of the present application.

Figure 6:
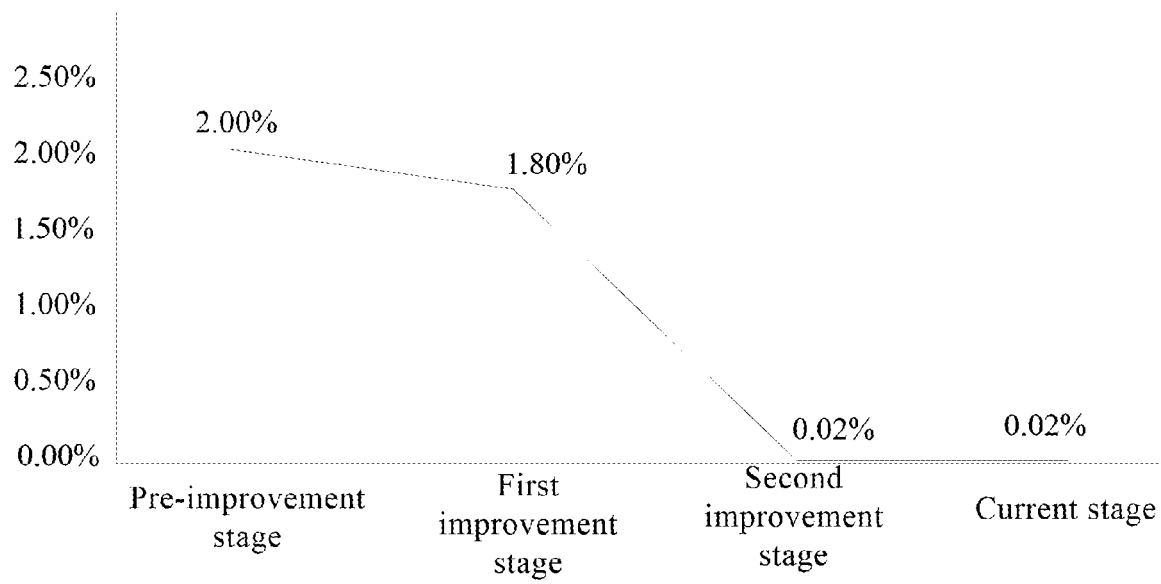
FIG. 6 shows an improvement comparison diagram of recognition effects by using a mark recognition device or a pseudo pressure alignment device mentioned in the present application according to yet still another embodiment of the present application.

FIG. 6 shows an improvement comparison diagram of recognition effects by using a mark recognition device or a pseudo pressure alignment device mentioned in the present application according to yet still another embodiment of the present application.

As shown in FIG. 6, in the graph, an abscissa refers to a process improvement stage. A pre-improvement stage, a first improvement stage, a second improvement stage and a current stage are used as main time nodes in the abscissa. An ordinate refers to a defect rate.

As shown in FIG. 6, a defect rate during the pre-improvement stage (poor recognition or poor bonding caused by the poor recognition) is 2%. After the first improvement stage (a stage of preliminary positioning of a first substrate P1 or a second substrate P2 by means of a mark recognition method), the defect rate decreases to 1.8%. After the second improvement stage (a stage of aligning the first substrate P1 and the second substrate P2 by means of tire mark recognition method) and the current stage, the defect rate decreases to 0.02%. It may be seen that after the marks of each stage of pseudo pressure alignment are recognized by using the mark recognition device or the pseudo, pressure alignment device according to the above embodiments of the present application, the defect rate may be reduced to 0.02%. Thereby a process yield of the pseudo pressure alignment may be significantly improved.

According to the above technical solutions, the first light sources are separately disposed from the image collecting mechanisms, and the part of the illumination light emitted by each of the first light sources in the marked region of the first substrate may generate the corresponding orthographic projection, and another part of the illumination light may be vertically transmitted to the corresponding image collecting mechanism. Thereby the marks 10 of the first substrate P1 may be recognized by the image collecting mechanisms according to the collected light and the orthographic projections generated by blocking the marks 10. In this way, a problem in the prior art that when the mark of the substrate is recognized by a reflection method, the mark is recognized inaccurately due to deviation of reflected light caused by concave and convex points on the substrate is avoided. During a process of the first substrate P1 being vertically transmitted by the illumination light in the embodiments of the present application, the deviation of transmitted light caused by the concave and convex points may be minimized or avoided as much as possible, so as to ensure that the projections generated by blocking the marks 10 are the orthographic projections as far as possible. Thereby the marks 10 may be accurately recognized. Moreover, by using the pseudo pressure alignment device mentioned in the above embodiments of the present application, the mark recognition device, the control device, the alignment mechanism and the pressing mechanism may be effectively controlled to work together. Thereby accuracy of the pseudo pressure alignment may be improved and a product production yield may be improved.

The above is only the embodiments of the present application, and is not intended to limit the scope of the present application. Various changes and modifications can be made to the present application by those skilled in the art. Any modification, equivalent substitution, improvement, etc. made within the spirit and principles of this present application shall be included in the scope of the appended claims of this present application.

What is claimed is:

1. A mark recognition device, applied to a substrate comprising a marked region, comprising an image collecting mechanism and a first light source;

the first light source emitting a light beam comprising a first light beam and a second light beam, wherein the first light source located directly above the image collecting mechanism makes the first light beam vertically irradiated to the marked region of the substrate and blocked by a mark of the marked region to generate a marked orthographic projection on the image collecting mechanism, and makes the second light beam penetrate and irradiate the substrate and vertically irradiated to the image collecting mechanism to form transmitted light and the image collecting mechanism recognizing the mark according to the marked orthographic projection of the mark and the second light beam.

2. The mark recognition device of claim 1, further comprising an optical compensation processor compensating the light beam emitted by the first light source;

wherein a compensated light beam passes through a transparent region of the marked region and is vertically irradiated to the image collecting mechanism, and the compensated light beam is optically compensated by a compensation algorithm executed by the optical compensation processor to ensure that the compensated light beam emitted by the first substrate is vertical transmitted light.

3. The mark recognition device of claim 1 further comprising a uniform scattering layer for uniform light;

wherein the uniform scattering layer is stacked on the substrate, and the light beam emitted by the first light source is irradiated to the substrate through the uniform scattering layer.

4. The mark recognition device of claim 3, wherein the uniform scattering layer is an Anisotropic Conductive Film layer.

5. The mark recognition device of claim 1, wherein the number of the first light sources is the same as the number of the marks of the marked region of the substrate, and the first light source is irradiated in one-to-one correspondence with the mark.

6. The mark recognition device of claim 1, wherein the first light source is one of a coaxial light source, a collector light source and a strip light source.

7. The mark recognition device of claim 1, further comprising a support table fixedly supporting the substrate.

8. The mark recognition device of claim 1, further comprising a second light source located at one side of the substrate close to the image collecting mechanism;

wherein the second light source is vertically irradiated to the marked region of the substrate, and light reflected by the mark of the marked region is vertically irradiated to the image collecting mechanism.

9. The mark recognition device of claim 8, wherein the second light source is located on the image collecting mechanism.

10. The mark recognition device of claim 8, wherein the substrate comprises a first substrate and a second substrate which are stacked, the first light source irradiating a mark of the first substrate for recognizing, and the second light source irradiating a mark of the second substrate for recognizing.

11. The mark recognition device of claim 10, wherein the first substrate is a Low Temperature Poly-Silicon substrate, and the second substrate is a Flexible Printed Circuit or a driver chip.

12. The mark recognition device of claim 8, wherein the number of the first light sources is at least one; and/or the number of the second light sources is at least one; and/or the number of the image collecting mechanisms is at least one.

13. A pseudo pressure alignment device, applied to a plurality of substrates comprising a marked region, comprising the mark recognition device of claim 1, a control device, an alignment mechanism and a pressing mechanism;

the control device being communicably connected with the mark recognition device, the alignment mechanism and the pressing mechanism separately; the mark recognition device recognizing marks of the plurality of substrates; the alignment mechanism performing an alignment operation on the plurality of substrates; the pressing mechanism performing a pressing operation on the plurality of substrates; and the control device controlling the alignment mechanism to perform the alignment operation and controlling the pressing mechanism to perform the pressing operation according to the marks recognized by the mark recognition device.

14. A mark recognition method, applied to a substrate comprising a marked region, executed by a mark recognition device, comprising an image collecting mechanism and a first light source, and the first light source being located directly above the image collecting mechanism, the mark recognition method comprising:

emitting, by the first light source, a light beam comprising a first light beam and a second light beam to the marked region of the substrate, the first light beam being vertically irradiated to the marked region of the substrate and blocked by a mark to form a marked orthographic projection, and the second light beam penetrating and irradiating the substrate and vertically irradiating to the image collecting mechanism to form transmitted light; and collecting, by the image collecting mechanism, the marked orthographic projection and the second light beam after penetrating and irradiating the substrate and vertically irradiating to the image collecting mechanism, and performing a mark recognition operation according to the marked orthographic projection and the second light beam after penetrating and irradiating the substrate and vertically irradiating to the image collecting mechanism.

* * * * *